(12) United States Patent
Liu et al.

(10) Patent No.: US 10,492,344 B2
(45) Date of Patent: Nov. 26, 2019

(54) POWER MODULE

(71) Applicant: Industrial Technology Research Institute, Hsinchu (TW)

(72) Inventors: Chun-Kai Liu, Taipei (TW); Yu-Lin Chao, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/705,271

(22) Filed: Sep. 15, 2017

(65) Prior Publication Data
US 2018/0007815 A1 Jan. 4, 2018

Related U.S. Application Data

(62) Division of application No. 14/788,808, filed on Jul. 1, 2015, now Pat. No. 9,807,914.

(30) Foreign Application Priority Data

Nov. 28, 2014 (TW) .............................. 103141432 A

(51) Int. Cl.
| | |
|---|---|
| *H05K 7/20* | (2006.01) |
| *H05K 7/14* | (2006.01) |
| *H05K 1/02* | (2006.01) |
| *H01L 23/473* | (2006.01) |
| *H01L 25/07* | (2006.01) |

(52) U.S. Cl.
CPC ....... *H05K 7/20927* (2013.01); *H01L 23/473* (2013.01); *H01L 25/07* (2013.01); *H05K 1/028* (2013.01); *H05K 7/1432* (2013.01); *H05K 7/20918* (2013.01)

(58) Field of Classification Search
CPC ............... H05K 1/028; H05K 7/20927; H05K 7/20254; H05K 7/1432; H05K 7/20918; H01L 23/473
USPC ............... 361/709, 699, 702; 165/80.4–80.5, 165/104.33; 257/714
See application file for complete search history.

(56) References Cited

U.S. PATENT DOCUMENTS

| | | | | |
|---|---|---|---|---|
| 3,277,346 A | * | 10/1966 | McAdam ................. | H01J 7/24 165/185 |
| 5,204,806 A | * | 4/1993 | Sasaki ................... | H05K 1/189 361/749 |

(Continued)

FOREIGN PATENT DOCUMENTS

CN        104052244        9/2014

OTHER PUBLICATIONS

"Office Action of China Counterpart Application," dated Sep. 26, 2017, p. 1-p. 8, in which the listed references were cited.

*Primary Examiner* — Dion Ferguson
*Assistant Examiner* — Amir A Jalali
(74) *Attorney, Agent, or Firm* — JCIPRNET

(57) ABSTRACT

A power module including a plurality of substrates, a plurality of power devices, and a heat dissipation assembly is provided. The substrates are located on different planes and surround an axis. Each of the substrates extends along the axis. The power devices electrically connected with each other are disposed on the substrates respectively. The heat dissipation assembly is disposed on the substrates and opposite to the power devices. Heat generated from the power devices is transferred to the heat dissipation assembly through the substrates.

11 Claims, 6 Drawing Sheets

(56) References Cited

U.S. PATENT DOCUMENTS

| | | | | |
|---|---|---|---|---|
| 5,537,074 A * | 7/1996 | Iversen | ............... | G05F 1/70 |
| | | | | 257/712 |
| 5,586,004 A * | 12/1996 | Green | ............ | H05K 7/20536 |
| | | | | 165/80.3 |
| 6,236,810 B1 * | 5/2001 | Kadotani | ............ | F25B 21/02 |
| | | | | 392/483 |
| 6,501,653 B1 * | 12/2002 | Landsgestell | ........ | H02M 7/003 |
| | | | | 165/185 |
| 6,580,608 B1 * | 6/2003 | Searls | ............ | H01L 23/3675 |
| | | | | 165/185 |
| 7,059,137 B2 * | 6/2006 | Childress | ........ | B60H 1/00264 |
| | | | | 62/259.2 |
| 7,105,959 B2 * | 9/2006 | Yamamoto | ........... | H02K 5/20 |
| | | | | 310/52 |
| 8,123,382 B2 * | 2/2012 | Patrick | ............ | F21V 29/004 |
| | | | | 362/218 |
| 2007/0279862 A1 * | 12/2007 | Li | ...................... | F21V 29/004 |
| | | | | 361/692 |
| 2009/0231812 A1 * | 9/2009 | Wiles | ............ | H01L 23/3735 |
| | | | | 361/699 |
| 2009/0284923 A1 * | 11/2009 | Rytka | ............ | H05K 7/20927 |
| | | | | 361/700 |
| 2013/0112369 A1 * | 5/2013 | Matsushima | ........ | H01L 23/473 |
| | | | | 165/67 |
| 2014/0268571 A1 | 9/2014 | Kang | | |
| 2014/0361672 A1 * | 12/2014 | Whang | ............... | G06F 1/20 |
| | | | | 312/223.2 |
| 2016/0088778 A1 * | 3/2016 | Geisler | .......... | H05K 7/20927 |
| | | | | 361/699 |

\* cited by examiner

POWER MODULE

CROSS-REFERENCE TO RELATED APPLICATION

This application is a divisional application of U.S. application Ser. No. 14/788,808, filed on Jul. 1, 2015, now allowed, which claims the priority benefit of Taiwan application serial no. 103141432, filed on Nov. 28, 2014. The entirety of each of the above-mentioned patent applications is hereby incorporated by reference herein and made a part of this specification.

TECHNICAL FIELD

The disclosure relates to a power module, and more particularly to a three-dimensional power module having a heat dissipation assembly.

BACKGROUND

In response to the global developing trend toward automation and energy saving, it requires adoption of inverters and motors to satisfy different needs for rotational speeds. Traditional inverters include power modules, driving board, control board, heat sink and passive components, and peripheral electronic devices, which leads to inverters oversize and overweight.

High efficiency and high power density have always been the requirements for inverters in the industry. High efficiency means reduction in energy consumption, which is beneficial for energy saving, emission reduction and environment protection while reducing costs. High power density means small volume, light weight, reduced transportation costs and spatial needs, which thereby reduces costs in the construction; high power density also means reduced use of materials, which is further beneficial for energy saving, emission reduction and environment protection.

Semiconductor devices are one of the important factors in determining the efficiency of inverters. However, the use of semiconductor devices inevitably needs to use heat dissipation device that help dissipate heat from semiconductors. These devices usually occupy a certain proportion in power converters. In general, current power modules are mostly composed of a planar structure or stacked on a plane of structure, and therefore a planar heat dissipation device is needed.

However, in addition to requiring a large-area substrate for bearing the power device, the heat dissipation of the power module also needs to have the planar heat dissipation structure. Thus, it is not easy for the power module to have more preferable space utilization, and it easily leads to unfavorable combination between the substrate bearing the power module and the heat dissipation assembly, which affects the performance and reliability of the power module in heat dissipation.

SUMMARY

A power module is provided, which enhances power density and heat dissipation performances via a vertical structure.

The power module of the disclosure includes a plurality of substrates, a plurality of power devices, and a heat dissipation assembly. The substrates are located on different planes and surround an axis, wherein each of the substrates extends along the axis. The power devices electrically connected with each other are disposed on the substrates respectively. The heat dissipation assembly is disposed on the substrates and opposite to the power devices. Heat generated from the power devices is transferred to the heat dissipation assembly through the substrates.

In order to make the aforementioned and other features and advantages of the disclosure comprehensible, several exemplary embodiments accompanied by figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
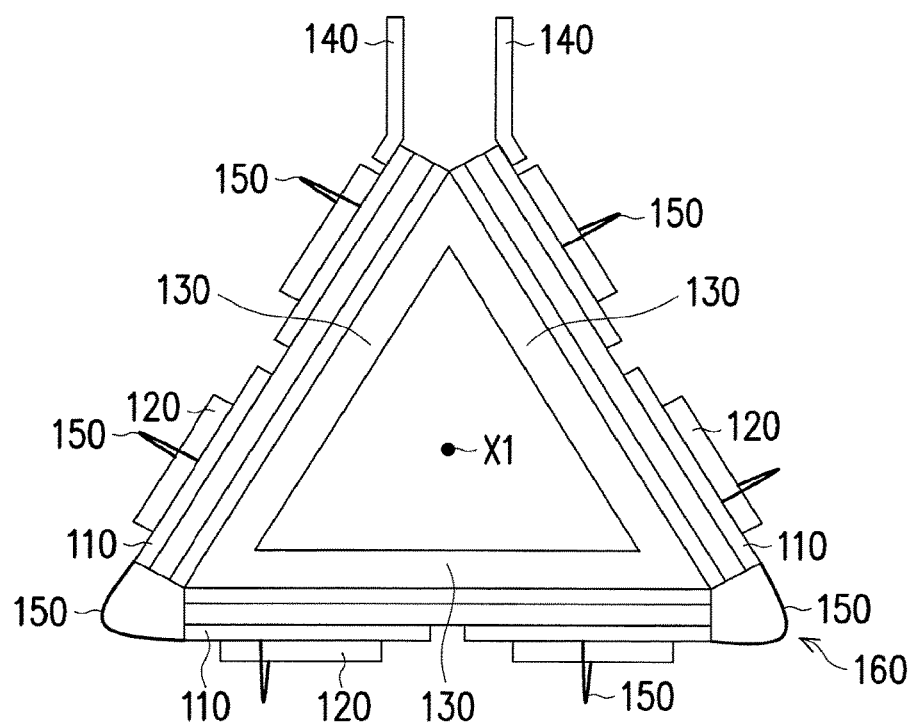
FIG. 1 is a top view of a power module according to an embodiment of the disclosure.
Figure 2:
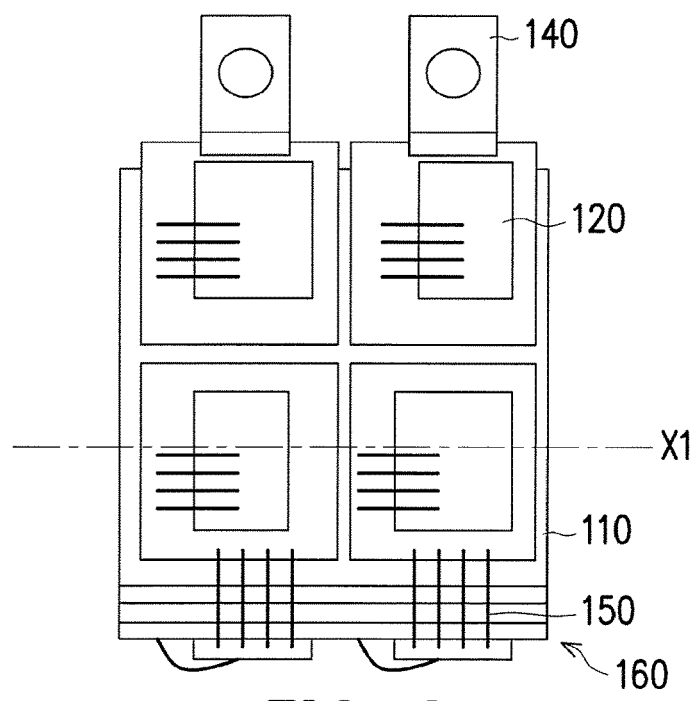
FIG. 2 is a side view of the power module of FIG. 1.

FIG. 1 is a top view of a power module according to an embodiment of the disclosure. FIG. 2 is a side view of the power module of FIG. 1. Referring to both FIGS. 1 and 2, in this embodiment, a power module 100 is adapted for a variety of apparatus, such as being used in inverter of a motor. The power module 100 includes a plurality of substrates 110, a plurality of power devices 120, at least one heat dissipation assembly 130 and a plurality of connecting terminals 140, wherein the material of the substrates 110 is, for example, ceramics, and these substrates 110 are located on different planes and surround an axis X1 while each of the substrates 110 extends along the axis X1. The power devices 120 are respectively disposed on the substrates 110, which are, for example, secured on the substrates 110 by soldering, and the power devices 120 are electrically connected to each other via conductive wires 150. Also, the power devices 120 disposed on different substrates 110 may also be electrically connected to each other via the conductive wires 150, and relevant circuit arrangements (not shown) may even be disposed on the substrates 110 to serve as means for electrically connecting different power devices 120.

Based on the above, in the power module of the disclosure, a columnar structure is formed via the three-dimensional structure, that is, the substrates for bearing the power devices are located on different planes and surround an axis, so that the heat dissipation assembly is mounted in the columnar structure. This arrangement reduces the area occupied by the power module due to the vertical structure, so as to be beneficial to installation and heat dissipation.

Furthermore, after the substrates 110 surround the axis X1 to form a three-dimensional structure, the heat dissipation assembly 130 is disposed on the substrates 110 and opposite to the power devices 120, so that the heat dissipation assembly 130 is located substantially in the structure formed by the substrates 110. The substrates 110 are disposed on the heat dissipation assembly 130 by soldering. In this embodiment, the substrates 110 include a metal layer located above (i.e., where the power devices 120 are disposed), an insulated layer located in the middle and a metal layer located below (i.e., near the heat dissipation assembly 130), wherein the metal layers may be copper layers, and the insulating layer may be made of ceramic materials such as aluminum oxide or aluminum nitride via manufacturing processes such as Direct Bond Copper (DBC). However, the disclosure is not limited thereto.

On the other hand, the power module 100 of the disclosure further includes a substrate interconnection structure 160. In this embodiment, the substrate interconnection structure 160 is, for example, a group structure of the conductive wires 150 and serves as electrical connection between circuits on the substrates 110 respectively under the premise that the substrates 110 have been soldered on the heat dissipation assembly 130. However, the form and number of the substrate interconnection structure 160 is not limited herein. For instance, the substrate interconnection structure 160 may also be a metal wire, metal foil, metal ribbon or metal bracket having a fixed shape and soldered on the substrates 110, or conductive structures such as flexible printed circuit board with conductive layer. In addition, after the power module 100 is disposed, a module housing (not shown) may be mounted, wherein, for example, the power module 100 as shown in FIG. 1 is disposed in a housing have a similar shape, and silicone is filled into the casing to prevent conductive lines 150 from contacting each other and protecting devices in the module, so as to avoid damages caused by vibration. Thereby, in addition to providing electrical connection between the substrates 110, the substrate interconnection structure 160 is also able to enhance the overall structural strength of the power module 100 and protection effects thereof.

In the embodiment, a module is formed by the three substrates 110 shown in FIG. 1, that is, the electricity on the power module 100 flows through the three substrates 110 (surrounding the axis X1) and then flows out via the connecting terminals 140.

In another embodiment of the disclosure that is not shown, each of the substrates independently forms a module, that is, each of the three substrates 110 are independent in a structure similar to that shown in FIG. 1. In this situation, three pairs of connecting terminals 140 are served as electrically conductive structures corresponding to each of the substrates 110, so as to adapt to each of the substrates 110 operating independently and the power devices 120 thereon. Under such a circumstance, the conductive wires 150 are not required between each of the substrates 110 for electrical connection, but other structural connections may still serve as the connection between the substrates 110 and the heat dissipation assembly 130.

The substrate interconnection structure 160 and the module casing are similarly applicable to other embodiments of the disclosure, and descriptions are provided with the embodiment of FIGS. 1 and 2 as a sample.

After the arrangements, the substrates 110 form an axisymmetrical columnar structure extending along the axis X1, so that the power devices 120 are substantially located on exposed surfaces of the columnar structure. Compared with current power devices assembled by stacking, in this embodiment, the user may easily assemble and repair the power devices 120 because the power devices 120 are exposed. Furthermore, when the substrates 110 surround the axis X1 so that a cross-section contour of the substrates 110 is a closed contour (the cross-section takes the axis X1 as a normal) and the power devices 120 are located outside the closed contour, the heat dissipation assembly 130 is able to use the space inside the closed contour for installation while dissipating the heat from all of the power devices 120.

In other words, in the vertical columnar structure, the power devices 120 between different substrates 110 are electrically connected to each other traversely while the heat is dissipated in a direction vertical to the substrate 110 and the power device 120. That is, the heat generated from the power devices 120 located outside the closed contour is transferred to the heat dissipation assembly 130 inside the closed contour through the substrates 110. The heat dissipation assembly 130 is able to dissipate the heat from all of the power devices 120 on the substrates 110 simultaneously, as shown in FIG. 1, so that the heat dissipation assembly 130 located in the closed contour is able to dissipate the heat from the power devices 120 in three sides simultaneously. Compared with current planar heat dissipation structures (as described above, disposing a plurality of power devices on the same substrate and further stacking the same on a plate-like heat dissipation member for heat dissipation), the three-dimensional power module 100 thereby has more heat dissipation performance.

Figure 3:
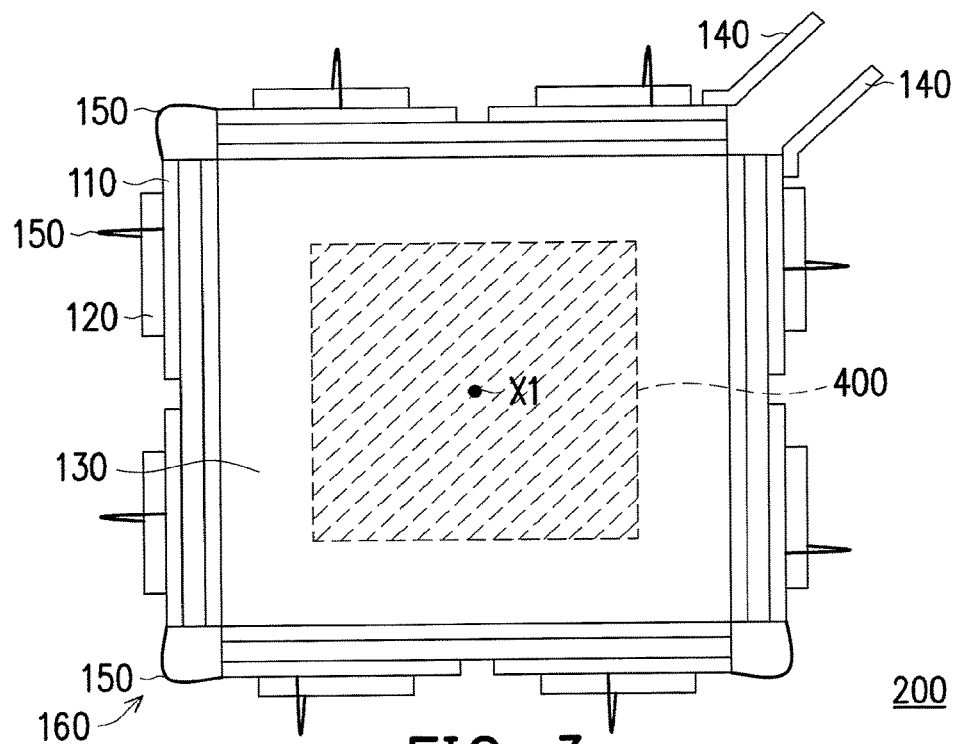
FIGS. 3 and 4 respectively illustrate schematic diagrams of a combination of a power module with an electronic apparatus in different embodiments.
Figure 4:
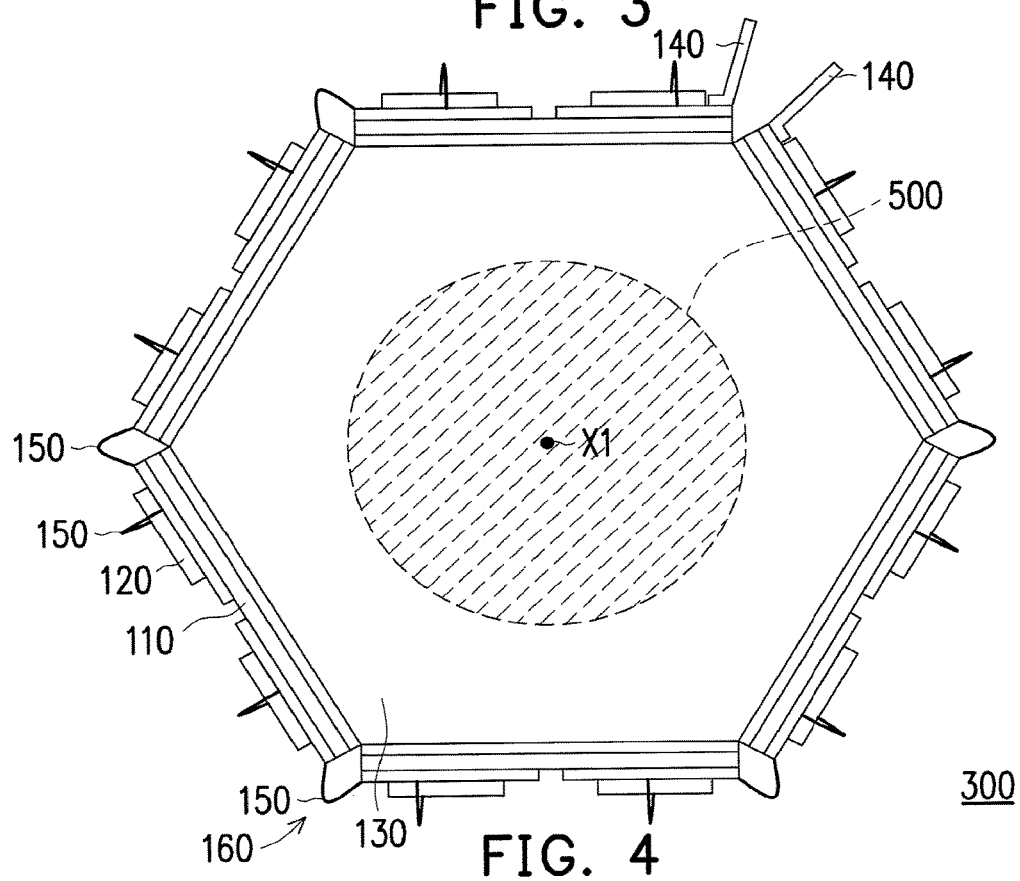

In this embodiment, the power module 100 forms a closed triangular contour for an inverter apparatus and is electrically connected to the motor body through the connecting terminals 140. However, the disclosure is not limited thereto. FIGS. 3 and 4 respectively illustrate schematic diagrams of a combination of a power module with an electronic apparatus in different embodiments. As described in the above, since the power module 100 is a hollow and vertical columnar structure, its interior space can be used to integrate with relevant electronic apparatus. As shown in FIG. 3, when an electronic apparatus 400 has a square contour, each of the substrates 110 and the power devices 120 of a power module 200 are disposed on different surfaces of the electronic apparatus 400. Similarly, as shown in FIG. 4, when an electronic apparatus 500 (such as the three-phase electric motor in the above) has a circular contour, each of the substrates 110 and power devices 120 of a power module 300 are disposed on the electronic apparatus 500.

In addition, referring to FIGS. 1, 3 and 4, since the power module 100 (200, 300) includes a plurality of substrates 110 (the number of which is not limited herein), the power module 100 (200, 300) has a bendable structural feature using the conductive wires 140 (or conductive copper foils or the like that have flexible conductive structures) as connecting media between adjacent substrates 110, so as to form an axisymmetrical/spiral closed/open contour, thereby being adapted for electronic apparatus having different shapes, as the polygon electronic apparatus 400 illustrated in FIG. 3 or the circular electronic apparatus 500 illustrated in FIG. 4. Meanwhile, the conductive structure also adequately increases the number of the substrates 110 and the power devices 120 thereon, which thereby also enhances expandability of the power module 100 (200, 300).

Figure 5:
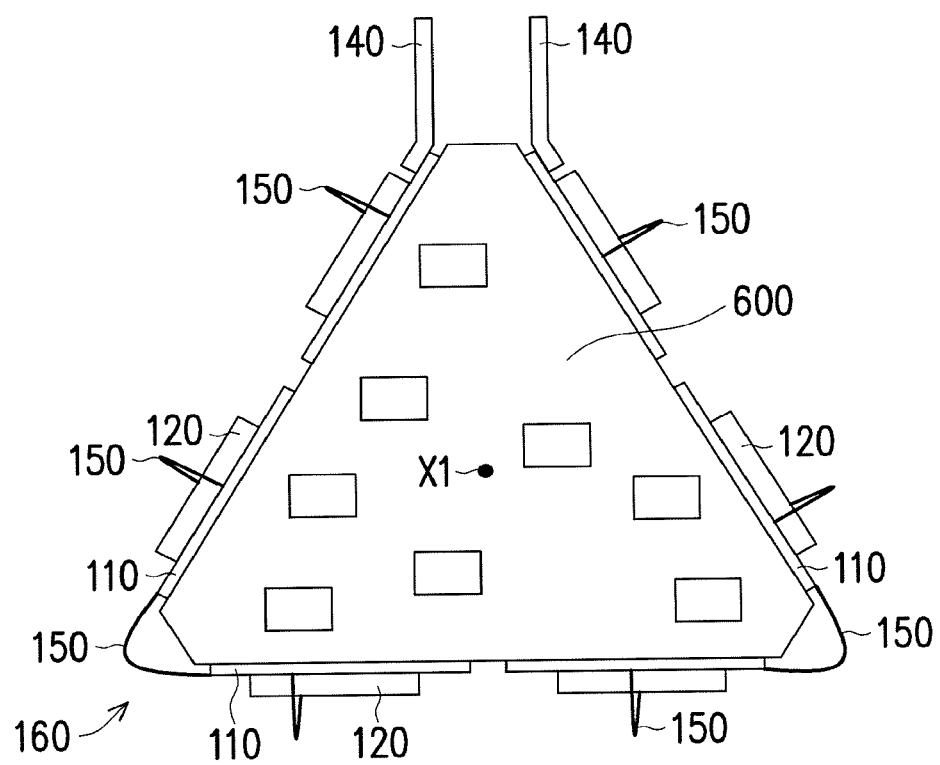
FIG. 5 illustrates a schematic diagram of a combination of a power module with an electronic apparatus in another embodiment.

FIG. 5 illustrates a schematic diagram of a combination of a power module with an electronic apparatus in another embodiment. Referring to FIG. 5, when the power module of FIG. 1 forms the columnar structure having openings on both ends as shown in FIG. 5 and has an electronic apparatus (not shown) installed in the formed closed contour, a control circuit board 600 may be disposed at at least one end of the openings on both ends so that the control circuit board 600 is electrically connected between the electronic apparatus and the power module 100 to complete system installation. Meanwhile, the shape of the control circuit board 600 matches the closed contour of the power module 100, which arrangement is also beneficial to the structure of the overall installation and provides utilization of space.

Below are specific descriptions of various heat dissipation manners.

Figure 6:
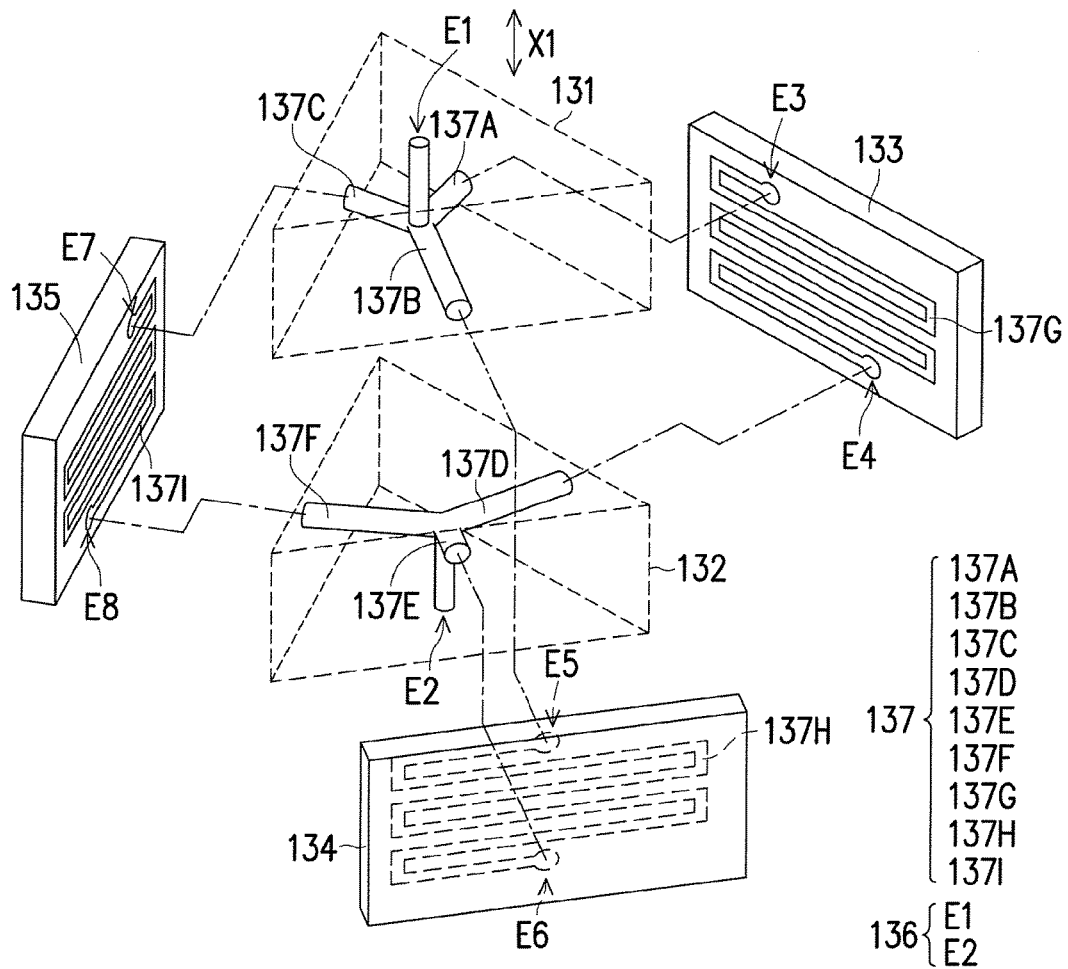
FIG. 6 illustrates an explosion diagram of a heat dissipation assembly in a power module in another embodiment of the disclosure.
Figure 7:
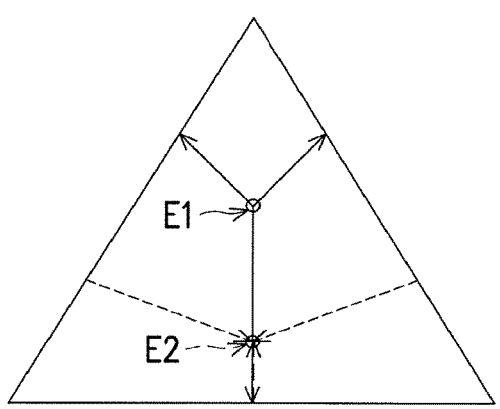
FIG. 7 illustrates a schematic diagram of the flow of a fluid in the heat dissipation assembly of FIG. 6.

FIG. 6 illustrates an explosion diagram of a heat dissipation assembly in a power module in another embodiment of the disclosure. FIG. 7 illustrates a schematic diagram of the flow of a fluid in the heat dissipation assembly of FIG. 6, wherein FIG. 7 illustrates a portion of the structure in FIG. 6 from a top view. Besides, the substrates 110 and the power devices 120 could be referred to embodiments and figures described above. Solid-line arrows represent fluid status in a member 132 while dotted lines represent the member, so as to clearly identify the flowing status of the fluid. Referring to both FIGS. 6 and 7 and compared with FIG. 1, as described above, since the substrates form a closed contour having accommodation space, the heat dissipation assembly can be disposed in the accommodation space so as to dissipate the heat from the power devices.

In FIGS. 6 and 7, a heat dissipation assembly 130 includes different members 131 to 135, a main channel 136 and a plurality of branch channels 137, wherein the main channel extends in the closed contour along the axis X1 and has an inlet E1 and an outlet E2. The members 133 to 135 correspond to the substrates 110 and are respectively disposed on one side of the substrates 110 opposite to the power devices 120, and the members 131 and 132 are disposed between the members 133 to 135, so that the main channel 136 and the branch channels 137 are adjoined. Positions of the inlet E1 and the outlet E2 of the main channel 136 are not limited herein. In this embodiment, the substrates 110 are divided into two ends along the axis X1 while the inlet E1 and the outlet E2 are located on opposite ends. In another embodiment that is not shown, the inlet and the outlet may be located on the same end, so that the fluid flows in and out of the power module from the same side of the substrate.

Herein, the branch channels 137 are divided into 137A to 137I, wherein the branch channels 137A to 137C are disposed in the member 131 and connected to the inlet E1 of the main channel 136, the branch channels 137D to 137F are disposed in the member 132 and connected to the outlet E2 of the main channel 136, the branch channels 137G to 137I are respectively disposed on the members 133 to 135 and each renders a curving path. Therein, the branch channel 137A is connected to an inlet E3 of the branch channel 137G, the branch channel 137D is connected to an outlet E4 of the branch channel 137G, the branch channel 137B is connected to an inlet E5 of the branch channel 137H, the branch channel 137E is connected to an outlet E6 of the branch channel 137H, the branch channel 137C is connected to an inlet E7 of the branch channel 137I, and the branch channel 137F is connected to an outlet E8 of the branch channel 137I. Accordingly, after the fluid flows from the inlet E1 of the main channel 136 into the heat dissipation assembly 130, the fluid splits and flows to the branch channels 137G to 137I of different members 133 to 135 through the branch channels 137A to 137C as shown by the solid-line arrows in FIG. 7, so as to dissipate the heat in the corresponding power devices 120 of the substrates 110 respectively. Then, the fluid converges and flows to the outlet E2 of the main channel 136 through the branch channels 137D to 137F to flow out of the heat dissipation assembly 130, so as to achieve the effect of heat dissipation.

In another embodiment that is not shown, the branch channels 137G to 137I located in the members 133 to 135 may also be formed directly on surfaces of the substrates 110 opposite to the power devices 120, i.e., inner surfaces of the closed contour. That means, the members 133 to 135 are substantially integral with the corresponding substrates 110, which thereby saves time and cost for manufacturing the power module. Furthermore, in yet another embodiment, the members 131 and 132 may also be non-physical structures which have the inlet E1, the outlet E2 and the branch channels 137A to 137F of the main channel 136.

Figure 8:
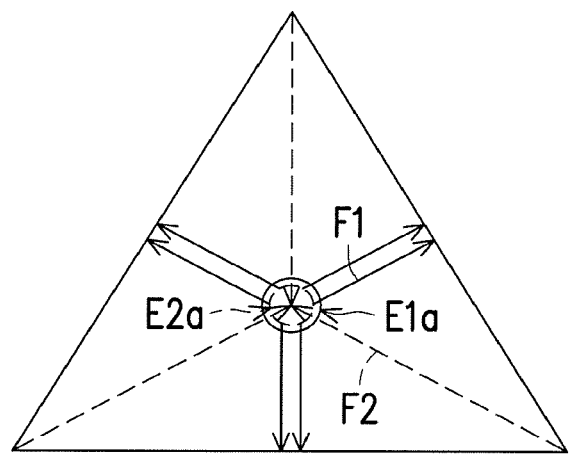
FIG. 8 illustrates a schematic diagram of the flow of a fluid in a heat dissipation assembly in another embodiment of the disclosure.
Figure 9:
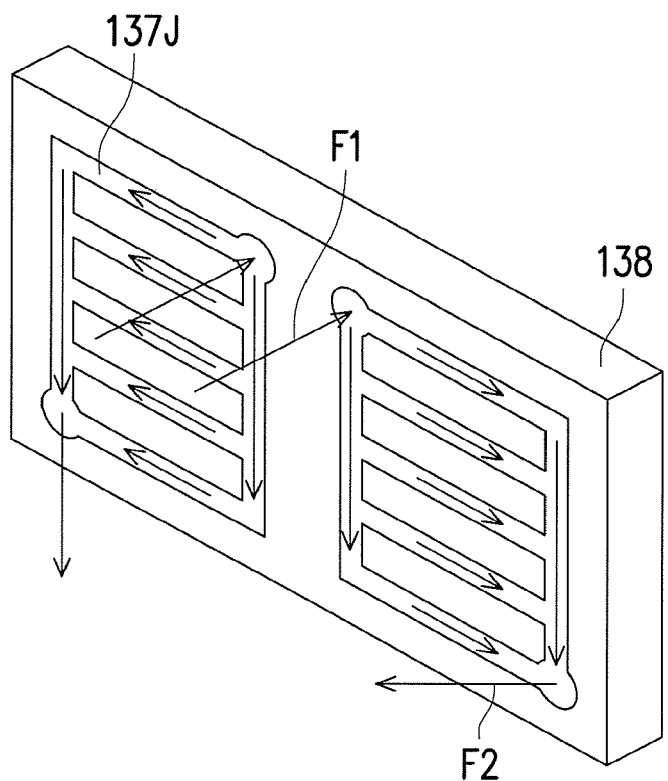
FIG. 9 illustrates a schematic diagram of a portion of components of the heat dissipation assembly of FIG. 8.

FIG. 8 illustrates a schematic diagram of the flow of a fluid in a heat dissipation assembly in another embodiment of the disclosure. FIG. 9 illustrates a schematic diagram of a portion of components of the heat dissipation assembly of FIG. 8, and a member 138 illustrated herein is similar to the member 133 in the above embodiment. Referring to both FIGS. 8 and 9, different from the above embodiment, the channel of this embodiment is designed to drive the fluid directly to the spot on the substrate 110 corresponding to the power device 120, wherein a branch channel 137J is left-right symmetrically disposed on the member 138, that is, the branch channel 137J as shown in FIGS. 8 and 9 are in a juxtaposed and end-to-end path. Therefore, a fluid F1 flowing in from an inlet E1a directly flows to the back side of the substrate 110 corresponding to the power device 120 after split-flow, and the heat dissipation path of the fluid is shortened due to a plurality of juxtaposed structures of the branch channel 137J, so as to achieve more heat dissipation effects. Finally, a fluid F2 flowing out of the member 138 and then flowing out after being converged at an outlet E2a.

Figure 10:
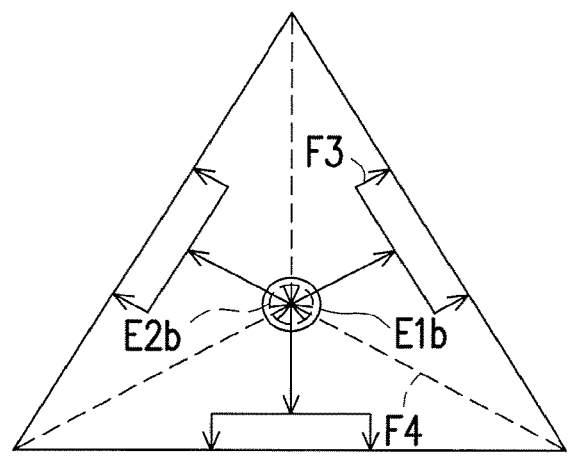
FIG. 10 illustrates a schematic diagram of the flow of a fluid in a heat dissipation assembly in another embodiment of the disclosure.

In addition, FIG. 10 illustrates a schematic diagram of the flow of a fluid in a heat dissipation assembly in another embodiment of the disclosure. Different from the above, a fluid F3 flowing in from an inlet E1b is directly sprayed on the spot on the substrate 110 corresponding to the power device 120 in a manner of jet or impingement flow after split-flow, that is, the branch channels located on the members 133 to 135 in the previous embodiment is replaced with the whole surface of the substrate 110 opposite to the power device 120 in this embodiment. Similarity lies in that after the fluid flows through the surface of the substrate 110 opposite to the power device 120, a returning flow F4 is converged and flows out of the heat dissipation assembly of the power module through an outlet E2b.

Figure 11:
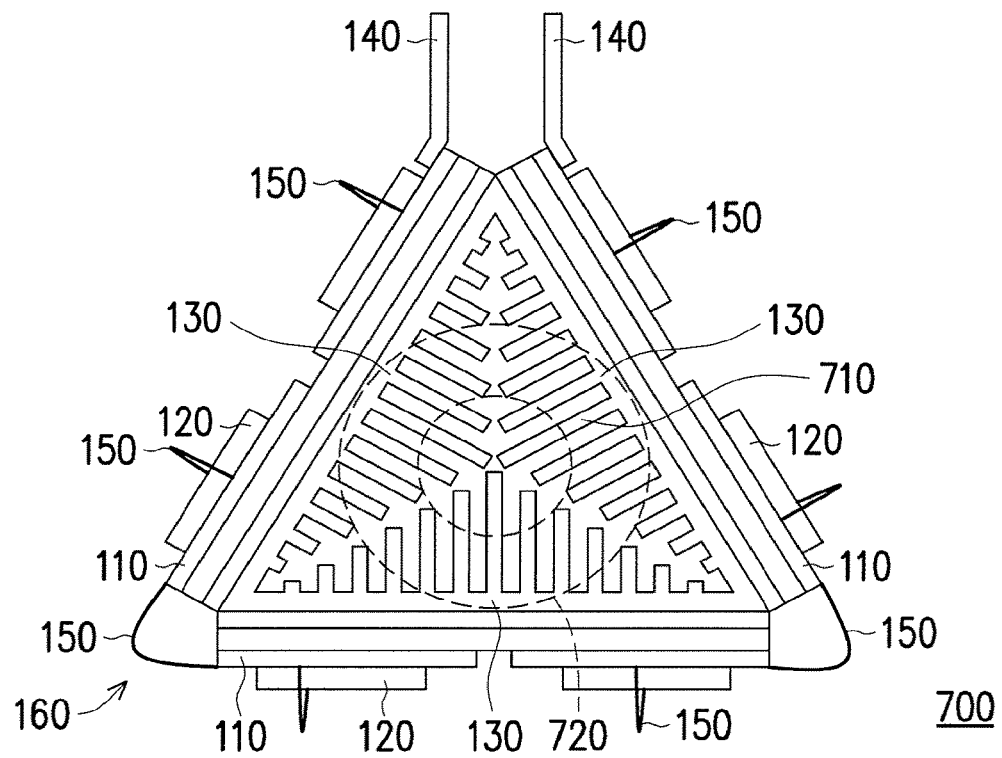
FIG. 11 illustrates a schematic view of a power module in another embodiment of the disclosure.

FIG. 11 illustrates a schematic view of a power module in another embodiment of the disclosure. Referring to FIG. 11, in the power module 700 of the embodiment, the heat dissipation assembly 130 includes a plurality of heat dissipation fins 710 extending in the closed contour from each of the substrates 110 away from the power devices 120. Furthermore, the heat dissipation assembly 130 further includes a fan 720 (a dotted-line contour in FIG. 11) disposed on at least one opening on ends of the columnar structured formed by the substrates 110, so that cooling air flows through the heat dissipation fins 710 for heat dissipation.

In view of the above, in the embodiments of the disclosure, the power module forms a columnar structure by the substrates being arranged surrounding an axis, so that the heat dissipation assembly or the electronic apparatus adaptable to the power module is disposed in the closed contour formed by the substrates. Therefore, compared with conventional power modules formed by stacking, the power module of the disclosure effectively enhances space utilization and reduces the area occupied thereby. Furthermore, the heat dissipation assembly located in the columnar structure and extending along the axis is thereby able to dissipate the heat from the power devices on the substrates since the heat dissipation assembly is able to serve the plurality of substrates. Therefore, compared with the conventional power modules formed by stacking that is not able to dissipate the heat separately, the power module of the disclosure effectively enhances heat dissipation efficiency and is not easily affected by deformation of materials.

Although the disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A power module, comprising:
   a plurality of substrates, located on different planes and surrounding an axis to form a closed contour, wherein each of the substrates extends along the axis;
   a plurality of power devices, disposed on the substrates respectively and electrically connected with each other; and
   a heat dissipation assembly, disposed on the substrates and opposite to the power devices, wherein the heat dissipation assembly comprises a plurality of heat dissipation fins extending from each of the substrates away from the power devices, wherein an extending length of the heat dissipation fins gradually increases from two sides of each of the substrates towards the middle of each of the substrates, the heat dissipation fins at the middle of each of the substrates extend to reach the axis which is a center of a cylinder composed of the substrates, and heat generated from the power devices is transferred to the heat dissipation assembly through the substrates,
   a control circuit board, disposed on an end of the closed contour.

2. The power module as recited in claim 1, wherein the power devices are located outside the closed contour, and the heat dissipation assembly is located inside the closed contour.

3. The power module as recited in claim 2, wherein the closed contour is a polygon.

4. The power module as recited in claim 2, wherein the substrates form a columnar structure having openings on both ends, and the closed contour is a cross-section contour of the columnar structure.

5. The power module as recited in claim 2, wherein an electronic apparatus is adapted for being disposed on the closed contour.

6. The power module as recited in claim 1, wherein the substrates are symmetrical with respect to the axis.

7. The power module as recited in claim 1, wherein each of the substrates is divided into two ends along the axis, and the heat dissipation assembly further comprises a fan that is disposed on another end of the closed contour opposite to the control circuit board, and the outer contour of the fan is an incircle of the closed contour.

8. The power module as recited in claim 1, wherein the substrates are electrically connected by a substrate interconnection structure.

9. The power module as recited in claim 8, wherein the substrate interconnection structure is a metal wire.

10. The power module as recited in claim 8, wherein the substrate interconnection structure is a flexible printed circuit board.

11. The power module as recited in claim 2, wherein an electronic apparatus is adapted for being disposed inside a receiving space that is surrounded by the closed contour, and the heat dissipation assembly is located between the electronic apparatus and the substrates.

* * * * *